United States Patent [19]
Yanai et al.

[11] Patent Number: 5,390,313
[45] Date of Patent: Feb. 14, 1995

[54] DATA STORAGE SYSTEM WITH DATA MIRRORING AND REDUCED ACCESS TIME DATA RETRIEVAL

[75] Inventors: Moshe Yanai, Framingham; Natan Vishlitzky, Brookline; Bruno Alterescu, Newton; Daniel Castel, Framingham, all of Mass.

[73] Assignee: EMC Corporation, Hopkinton, Mass.

[21] Appl. No.: 587,026

[22] Filed: Sep. 24, 1990

[51] Int. Cl.⁶ .................... G11B 15/46; G11B 5/012; G06F 11/00
[52] U.S. Cl. .................................. 395/425; 395/575; 364/268.3; 364/268.5; 364/DIG. 1; 364/948.3; 371/40.1; 371/51.1; 360/47; 360/73.01; 360/73.07; 360/97.01; 360/98.01; 360/98.07
[58] Field of Search .................. 395/425, 575; 360/73.01, 73.07, 97.01, 98.01, 98.07, 47; 371/40.1, 51.1; 364/268.3, 268.5, DIG. 1

[56] References Cited

U.S. PATENT DOCUMENTS

| | | | |
|---|---|---|---|
| 3,729,725 | 4/1973 | Denney et al. | 360/47 |
| 3,999,163 | 12/1976 | Levy et al. | 340/172.5 |
| 4,011,587 | 3/1977 | Arter et al. | 360/62 |
| 4,012,128 | 3/1977 | Regan | 351/17 |
| 4,187,538 | 2/1980 | Douglas et al. | 364/200 |
| 4,862,411 | 8/1989 | Dishon et al. | 364/952 |
| 4,918,651 | 4/1990 | Bonke et al. | 364/900 |
| 4,935,828 | 6/1990 | Frissell | 360/98.01 X |
| 5,005,174 | 4/1991 | Bruckert et al. | 364/DIG. 1 |
| 5,063,454 | 11/1991 | Hashimoto | 360/78.04 |

OTHER PUBLICATIONS

"Shadowing Boosts System Reliability" by Bates et al., Computer Design, Apr. 1985, pp. 129–137.
"Arm Scheduling in Shadowed Disks" by Dina Bilton, IEEE Digest of CompCon, 1989, Feb. 27, 1989–Mar. 3, 1989, pp. 132–136.
IBM 3390 Disk Technology, ©1990, Computer Technology Research Corp., in its entirety (full text may be found in copending U.S. Appln. 07/586,796, filed Sep. 24, 1990, our file EMC-103XX).
IBM 3880 Storage Control Models 1,2,3 and 4 Description Manual, IBM Publication No. GA26-1661-9, ©1987, IBM Corporation, in its entirety (full text may be found in copending U.S. Appln. 07/586,796, filed Sep. 24, 1990, our file EMC-103XX).

*Primary Examiner*—Joseph L. Dixon
*Assistant Examiner*—B. James Peikari
*Attorney, Agent, or Firm*—Daniel J. Bourque; Anthony G. M. Davis; Michael Bujold

[57] ABSTRACT

A data storage system with data mirroring and reduced access time data retrieval includes at least one pair of rotating data storage media each having a plurality of generally identical data records. Each rotating data storage medium includes position indicators, for providing one or more indications of the rotational position of each of the rotating data storage media with respect to its associated fixed position read/write mechanism. A position monitor receives the rotational position indications from each rotating data storage medium and computes and monitors the rotational position of each rotating storage medium with respect to its associated read/write mechanism. After receiving a request for access to one or more data records stored on the pair of rotating data storage media, the system computes projected data access times for retrieving the requested data record on each of the rotating data storage media, and commands retrieval of the requested data record to the rotating data storage medium having the shortest projected data access time based on the rotational position and state of the respective data storage medium.

14 Claims, 2 Drawing Sheets

DATA STORAGE SYSTEM WITH DATA MIRRORING AND REDUCED ACCESS TIME DATA RETRIEVAL

FIELD OF THE INVENTION

This invention relates to rotational data storage systems such as disk drives and more particularly, to a disk system for providing data mirroring and reduced data retrieval access time times.

BACKGROUND OF THE INVENTION

Many computer systems such as those systems used by scientists and airline reservations systems must process and store large amounts of data. Loss of data caused by data storage medium storage failure or damage could take many man years to replace, if replacable at all. Thus, many of these users are demanding more fault tolerant data storage systems.

As the capacity of disk drives and other such direct access rotating data storage media has been increased, there has been a decrease in the price and size of such devices. One solution for providing the required fault tolerance is to provide a data mirroring feature wherein each data storage medium has a duplicate storage medium or mirror image operating in parallel with the primary device. Such a system allows the user to make a second copy on a second storage medium, of every data file as it is written to the primary storage medium. On such a system, data may be read from either the main data storage medium or the "mirror" medium.

Although providing a data "mirror" medium does result in additional system costs and other associated overhead, the resulting benefits of data redundancy often far outweigh the costs. Such costs could be further counterbalanced if data-mirroring systems could provide additional system performance during "read" operations which typically comprise 70% of the requests from the host system.

SUMMARY OF THE INVENTION

This invention features a data storage system with data mirroring and data access time computation, for reducing data access time. The present invention includes at least one pair of rotating direct access data storage devices or (DASD) such as disk drives. Each of the rotating data storage devices or media include a plurality of generally identical data records and one or more fixed position read/write mechanisms. In one embodiment, each of the rotating data storage media also includes a rotational position indicator, for providing one or more indications of the rotational position of each of the rotating data storage media with respect to its associated fixed position read/write mechanism.

After receiving a request for access to one or more data records stored on the first and second rotating data storage media, a data access controller utilizes the address of the one or more requested data records on the data storage medium to compute first and second projected access times for retrieving the one or more requested data records on each of the rotating data storage media. The data access controller then assures retrieval of the requested data record(s) from the storage medium having the shortest projected data access time. In order to compute the shortest project data access time, the data access controller monitors and utilizes the storage media's latency position, seek position, and bus utilization state.

In one embodiment, each of the rotating data storage media also includes a rotational position indicator, for providing one or more indications of the rotational position of each of the rotating data storage media with respect to its associated fixed position read/write mechanism.

Also included are a position monitor which receives the rotational position indications from each of the rotating data storage media, for monitoring and computing the rotational position of each of the rotating data storage media with respect to its associated read/write mechanism.

After receiving a request for access to one or more data records stored on the first and second rotating data storage media, a data access controller utilizes the address of the one or more requested data records on the data storage medium along with the computed rotational position of each of the rotating data storage media, to compute first and second projected access times for retrieving the one or more requested data records on each of the rotating data storage media.

BRIEF DESCRIPTION OF THE DRAWINGS

These, and other features and advantages of the present invention are described below in the following detailed description and accompanying drawings, in which.

DETAILED DESCRIPTION OF THE INVENTION

Figure 1:
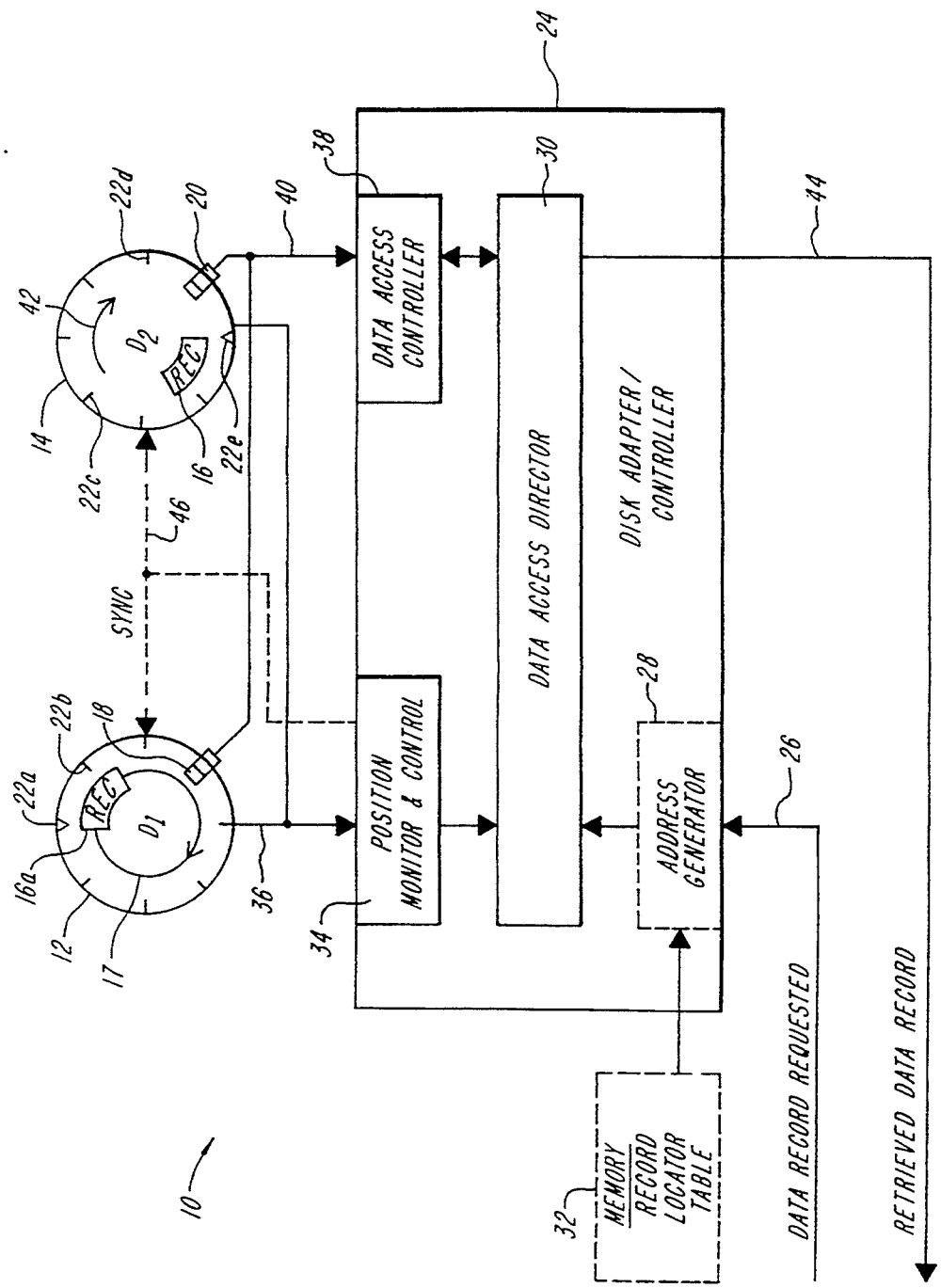
FIG. 1 is a block diagram of the disk storage system with data mirroring and reduced access time data retrieval according to the present invention.

The data storage system with data mirroring and reduced access time data retrieval 10, FIG. 1 according to the present invention includes at least one pair of rotating data storage media 12 and 14 such as disk drives, optical disks or similar devices. Each of the rotating data storage media include a number of generally identical data records 16a, 16b which are stored at the same logical address on each of the storage media 12, 14.

To access the stored data records, each rotating data storage medium includes one or more fixed position read/write mechanisms 18 and 20. Such read/write mechanisms include a movable read/write head in the case of disk drives, or a laser system used to read optically encoded storage media.

Each data record such as data record 16a stored on storage medium 12 and identical data record 16b stored on storage medium 14 is stored at the identical logical address on each device. The rotating data storage media 12 and 14 are direct access storage devices generally including a plurality of concentric "tracks" such as track 17 on storage medium 12. Each track and its associated data records can be read by the fixed position read/write mechanism during one rotation of the storage medium.

In one embodiment, each rotating data storage medium includes one or more position indicator means such as position indicators 22a and 22b. Position indicators 22a and 22b serve as an index or primary position indicator to confirm the rotational position of each of the rotating data storage media with respect to its associated fixed position read/write mechanism and indicate the logical beginning of each rotating data storage medium. It should be noted that in order to facilitate reduced access time data retrieval according to the present invention, each pair of rotating data storage media should be out of phase; that is, their respective index marks should not be aligned with respect to the media read/write mechanism. The rotating data storage media generally include the circuitry necessary to monitor and provide an indication of the position of the rotating data storage medium over signal path 36, as the position indicators are sensed or detected as well known in the art. An example of such rotating data storage media include 5¼ disk drives available from Fujitsu as Model no. M2266SA.

The system of the present invention also includes one or more disk adapter/controllers 24. Disk adapter/controller 24 receives a request for one or more data records over signal path 26 which may include a parallel or serial data path. Each data record requested includes at least a record identifier which uniquely identifies the requested record from among a plurality of records. Such an identifier may include the "count" portion of a CKD formatted data record or any other suitable unique identification employed to specify the requested data record. Additionally, the request for a data record may also be accompanied by the address of the record on the storage medium.

The request for a data record is received by address generator portion 28 of disk adapter/controller 24. If the requested data record also includes the storage medium address, address generator 28 merely passes on that address to data access director 30.

If, however, the requested data record is only identified by its unique record identifier, address generator 28 must then look-up or compute the address o#the data record. In one embodiment, address generator 28 accesses memory such as external semiconductor memory unit 32 which contains a record locator table comprised of a record identifier for each of the data records stored on rotating data storage media 12 and 14, along with an associated logical address at which the data record is located on the storage media. Address generator 28 then provides the appropriate logical address to data access director 30.

Data access director 30 also receives as input one or more signals from disk position monitor and control unit 34. The disk position monitor and control unit receives the position indications from the rotating data storage media 12 and 14, monitoring and computing the rotational position of each rotating data storage medium with respect to its associated read/write mechanism. The position indications from the data storage media are transmitted to the disk position monitor and controller 34 over signal path 36.

After receiving the address(es) of the one or more data records requested from address generator 28 along with the current rotating data storage medium position information from position monitor and controller 34, data access director 30 proceeds to compute projected data access times for each of the rotating storage media. Since each of the rotating data storage media is out of phase with one another, one of the rotating data storage media will be able to access each requested data record in a shorter period of time than the other storage medium. In computing the projected data access times for each of the rotating data storage media, data access director 30 takes into account the current position of each data storage media 12 and 14 with respect to read/write mechanisms 18 and 20; the time that it will take for the read/write mechanism to move from its current track position to the track on which the desired record is located; as well as the degree of rotation that the rotating data storage medium will travel during the time that each read/write mechanism move from their current position over the current track to the desired position over the track which contains the requested data record(s).

The data access director 30 may be implemented in hardware, software, firmware or a combination thereof. Accordingly, data access time computation can be performed in only several microseconds. Subsequently, data access controller 38 will command the rotating data storage medium with the shortest projected access time to move its read/write mechanism and read the requested data record over signal path 40. If, for example, rotating data storage media 12 and 14 are 180° out of phase, data access time can be reduced to one half the time of conventional systems.

For example, if access to record 16 which exists as record 16a on rotating storage medium 12 and record 16b on rotating storage medium 14 is desired, it is clear that data storage medium 14 rotating in the direction of arrow 42 must wait approximately ¾ of a revolution time period before record 16b will be positioned under read/write mechanism 20. In contrast, record 16a on rotating data storage medium 12 will be positioned under its associated read/write mechanism 18 in only approximately ¼ of a revolution time period and thus, storage medium 12 will be able to access the requested data record in one half the time of rotating data storage medium 14. The data record(s) retrieved by data access controller 38 is then provided to the requesting device over signal path 44.

Although the two rotating data storage media are shown 180° out of phase, this is for exemplary purposes only and indeed, any degree of phase shift may be employed based upon the desired increase in system performance. One factor in measuring system performance that must be considered is writing data records to the data storage media which must be performed twice given that the rotating storage media are out of phase with one another. Such a sacrifice in increased system performance is, however, greatly outweighed by the increased performance during reading data records which, as previously stated, comprises approximately 70% of requests from host systems.

Therefore, in order to be able to control system performance, the system of the present invention may include a synchronization signal path 46 between the rotating storage medium 14 and the position monitor and controller 34. The synchronization signal may include a delay 35 to alter the phase relationship between the two rotating data storage media. Thus, the phase relationship of the rotating data storage media may be dynamically changed and controlled during the operation of the system under the control of disk adapter/controller 24 or the host system.

Figure 2:
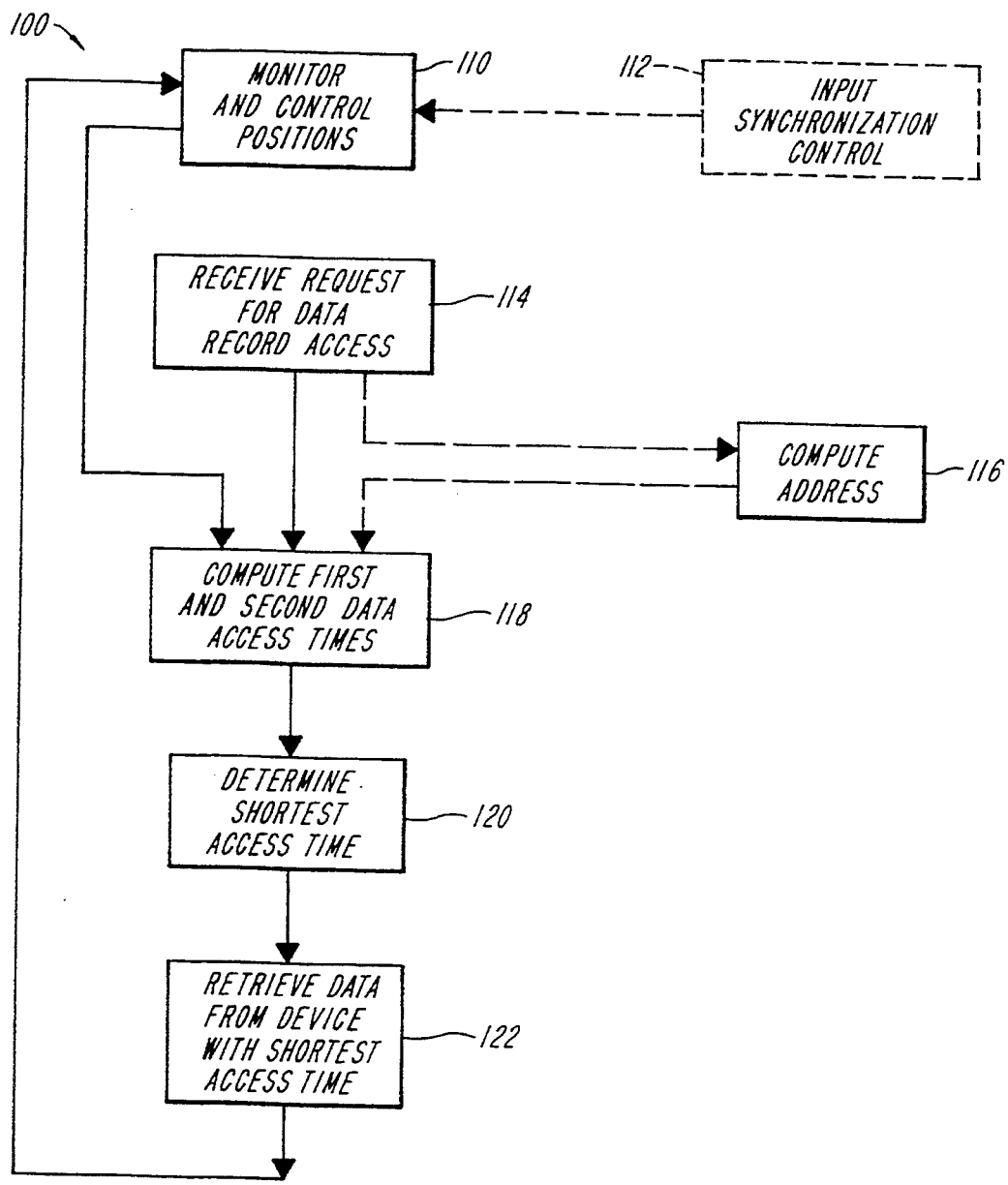
FIG. 2 is a flowchart of the method for providing reduced access time data retrieval in accordance with the present invention.

Flowchart 100, FIG. 2, illustrates the access time computation process. The position of the rotating data storage media is monitored as illustrated in step 110. In one embodiment, rotational position input and synchronization control output may be provided at step 112 and used to monitor and control the position or phase relationship of the rotating data storage media at step 110.

After receiving a request to access one or more data records, step 114, the system proceeds to determine whether the requested data record included only a record identifier, in which case the system proceeds to step 116 and computes the address of the data record on the storage medium. If the request for data record access included the address of the requested data record, the system proceeds directly to step 118 and utilizing the address of the requested data record and the current position of the rotating data storage media from step 110 computes first and second data access times for retrieving the requested data record on each of the first and second rotating data storage media, step 118. After determining which rotating data storage medium will have the shortest access time, step 120, the system commands the device with the shortest access time to retrieve the requested data record, step 122, before returning to the steps of monitoring the position of the rotating data storage media and awaiting request for access to one or more data records.

Modifications and substitutions of the present invention by one of ordinary skill in the art are considered to be within the scope of the present invention, which is not to be limited except by the claims which follow.

We claim:

1. A system for reducing data access time comprising:
   at least first and second selectable rotating data storage media, each of said rotating data storage media having a rotationally fixed position read/write mechanism, each of said rotating data storage media also including at least a plurality of generally identical data records, said first rotating data storage medium having a rotational phase relationship with said second rotating data storage medium such that said first rotating data storage medium is rotating out of phase with respect to said second rotating data storage medium;
   each of said rotating data storage media further including indicator means, for providing an indication of the rotational position of each rotating data storage medium with respect to its associated fixed position read/write mechanism;
   means, responsive to at least one said rotational position indication provided by each of said first and second rotating data storage media, for controlling said rotational phase relationship of said first and second rotating data storage media relative to each other, and for assuring that said first and second rotating data storage media are rotating out of phase with each other;
   means for receiving a single command to write at least one data record to one of said first and second rotating data storage media;
   means, responsive to said received single command to write said at least one data record, for issuing a first write command to write said at least one data record to said first rotating data storage medium, and for independently issuing a second write command to write said at least one data record to said second rotating data storage medium;
   wherein said second rotating data storage medium is available for data access during the issuance of said first write command to said first rotating data storage medium, and said first rotating data storage medium is available for data access during issuance of said second write command to said second rotating data storage medium;
   position monitoring means, responsive to said rotational position indication from each of said rotating data storage media, for computing and monitoring the rotational position of each of said rotating data storage media with respect to its associated read/write mechanism;
   means for receiving a request for access to said at least one data record stored on said first and second rotating data storage media; and
   means, responsive to said position monitoring means and to said means for receiving a request for data access, for computing said first and second projected data access times for said first and second rotating storage media, and for directing retrieval of the at least one requested data record to said first or second rotating data storage medium having the shortest projected data access time.

2. The system of claim 1 wherein said rotating data storage medium includes a disk drive.

3. The system of claim 2 wherein said disk drive includes a fixed block disk drive.

4. The system of claim 1 wherein said at least one requested data record includes at least one address at which the data record is stored on said rotating storage media.

5. The system of claim 1 wherein said at least one requested data record includes a record identification portion and wherein said means for computing first and second projected data access times computes the address of the requested data on the first and second rotating data storage media.

6. The system of claim 5 wherein said requested data record includes a CKD formatted data record including at least a count portion, and wherein said means for computing computes, from the count portion of said CKD formatted data record, the address for each of said requested data records stored on said first and second rotating data storage media.

7. The system of claim 1 wherein said means for controlling maintains said first rotating data storage medium 180° out of phase with said second rotating data storage medium.

8. The system of claim 1 wherein said position monitoring means includes a counter responsive to said at least one rotational position indication.

9. The system of claim 1 wherein said rotational position indicator means includes a plurality of reference marks generally equally spaced around each of said rotating data storage medium.

10. The system of claim 1 wherein said rotational position indicator means includes an index mark, for indicating the physical beginning of each of the rotating data storage media.

11. A system for reducing data access time on a pair of disk drive storage units having rotationally fixed position read/write mechanisms and data-mirroring, comprising:
   at least first and second selectable disk drives, each of said disk drives including a plurality of generally identical data records, said first disk drive having a phase relationship with said second disk drive, such that said first disk drive is rotating out of phase with respect to said second disk drive;
   means, responsive to at least one rotational position indication provided by each of said first and second disk drives, for controlling said phase relationship of said first and second disk drives relative to each other, and for assuring that said first and second disk drives are rotating out of phase with each other;

means for receiving a single command to write at least one data record to one of said first and second disk drives;

means, responsive to said received single command to write at least one data record, for issuing a first write command to write said at least one data record to said first disk drive, and for independently issuing a second write command to write said at least one data record to said second disk drive;

wherein said second rotating data storage medium is available for data access during the issuance of said first write command to said first rotating storage medium, and said first rotating data storage medium is available for data access during issuance of said second write command to said second rotating data storage medium, each of said disk drives also including indicator means, including a plurality of reference marks generally equally spaced around each of said disk drive storage units, for providing a corresponding plurality of indications of the rotational position of each of the disk drives with respect to its associated rotationally fixed position read/write mechanism;

position monitoring means, responsive to said corresponding plurality of rotational position indications, for computing and monitoring the rotational position of each of said first and second disk drives;

means for receiving a request for access to said at least one data record stored on said first and second disk drives, said at lease one requested data record identified by a record identifier, for uniquely identifying said at least one data record from among a plurality of data records;

means, responsive to said means for receiving, for computing from said at least one record identifier, at least one address on said first and second disk drives at which said at least one requested data record is located; and means, responsive of said position monitoring means and to said means for computing, for calculating first and second projected data access times for accessing said requested data records on each of said first and second disk drives, and or directing data retrieval to said first or second disk drive having the shortest projected data access time.

12. A method for reducing data access time on a pair of rotating data storage media including first and second selectable rotating storage media each having a plurality of tracks, and including a plurality of generally identical data records, each of said rotating data storage media having at least one rotationally fixed position read/write mechanism, said first rotating data storage medium having a rotational phase relationship with said second rotating data storage medium such that said first rotating data storage medium is rotating out of phase with respect to said second rotating data storage medium, comprising the steps of:

monitoring the rotational position of said first and second rotating data storage media with respect to their associated rotationally fixed position read/write mechanism;

monitoring the read/write mechanism position of said first and second rotating data storage media with respect to at least one track;

controlling said rotational phase relationship between said first and second rotating data storage media in response to said step of monitoring the rotational position of said first and second rotating data storage media, and assuring that said first and second rotating data storage media are rotating out of phase with each other;

receiving a single command to write at least one data record to said first and second rotating data storage media;

storing said at least one data record to be written to said first and second rotating data storage media in memory;

issuing, in response to said received single command to write said at least one data record, a first write command to cause said at least one data record stored in said memory to write out said first rotating data storage medium and, independently issuing a second write command to cause said at least one data record stored in said memory to be written to said second rotating data storage medium wherein said second rotating data storage medium is available for data access during the issuance of said first write command to said first rotating data storage medium, and said first rotating data storage medium is available for data access during issuance of said second write command to said second rotating data storage media;

receiving a request for access to said at least one data record stored on said first and second rotating data storage media;

computing first and second projected data access times for accessing the at least one requested data record for said at least one of first and second rotating data storage media;

comparing said first and second projected data access times to determine the shortest data access time for said requested data record; and directing the rotating data storage medium with the shortest data access time to retrieve the at least one requested data record.

13. The method of claim 12 further including after the step of receiving a request for access to at least one data record the step of:

computing the address on the first and second rotating data storage medium at which the at least one requested data record is respectively stored.

14. A system for reducing data access time comprising:

at least first and second selectable rotating data storage media, each of said rotating data storage media having a rotationally fixed position read/write mechanism, each of said rotating data storage media also including at least a plurality of generally identical data records, said first rotating data storage medium having a rotational phase relationship with said second rotating data storage medium, such that said first rotating data storage medium is rotating out of phase with respect to said second rotating data storage medium;

means, responsive to at least one rotational position indication provided by each of said at least first and second rotating data storage media, for controlling said rotational phase relationship of said at least first and second rotating data storage media relative to each other, and for assuring that said at least first and second rotating data storage media are rotating out of phase with each other;

means for receiving a single command to write at least one data record to one of said first and second rotating data storage media;

means, responsive to said received single command to write said at least one data record, for issuing a first write command to write said at least one data record to said first rotating data storage medium, and for independently issuing a second write command to write said at least one data record to said second rotating data storage medium;

wherein said second rotating data storage medium is available for data access during the issuance of said first write command first rotating data storage medium, and said first rotating data storage medium is available for data access during issuance of said second write command to said second rotating data storage medium;

means for receiving a request for access to said at least one data record stored on said first and second rotating data storage media; and means, responsive to said means for receiving a request for data access, for computing first and second projected data access times for said first and second rotating data storage media, and for directing retrieval of the at least one requested data record to said first or second rotating data storage medium having the shortest projected data access time.

* * * * *